United States Patent
Egan et al.

(10) Patent No.: US 8,526,218 B2
(45) Date of Patent: Sep. 3, 2013

(54) MEMORY DESIGN

(75) Inventors: Paul Egan, Edinburgh (GB); Simon Chang, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 148 days.

(21) Appl. No.: 13/009,583

(22) Filed: Jan. 19, 2011

(65) Prior Publication Data

US 2011/0205786 A1   Aug. 25, 2011

(30) Foreign Application Priority Data

Feb. 23, 2010   (GB) .................................. 1003009.6

(51) Int. Cl.
*G11C 11/00* (2006.01)
(52) U.S. Cl.
USPC ............................. 365/154; 365/155; 365/156
(58) Field of Classification Search
USPC ......................................... 365/154, 155, 156
See application file for complete search history.

(56) References Cited

U.S. PATENT DOCUMENTS

| 5,563,839 | A  | * | 10/1996 | Herdt et al. | 365/227 |
|---|---|---|---|---|---|
| 7,196,960 | B2 | * | 3/2007 | Isoda et al. | 365/227 |
| 7,352,611 | B2 | * | 4/2008 | Isoda et al. | 365/154 |
| 7,400,523 | B2 | * | 7/2008 | Houston | 365/154 |
| 7,619,947 | B2 | * | 11/2009 | Houston | 365/229 |
| 7,679,949 | B1 | * | 3/2010 | Masleid | 365/154 |
| 7,742,326 | B2 | * | 6/2010 | Houston | 365/154 |
| 7,983,071 | B2 | * | 7/2011 | Houston | 365/154 |
| 8,233,341 | B2 | * | 7/2012 | Deng et al. | 365/201 |
| 2006/0239068 | A1 | | 10/2006 | Boemler | |

* cited by examiner

*Primary Examiner* — Pho M Luu
(74) *Attorney, Agent, or Firm* — Fulbright & Jaworski LLC

(57) ABSTRACT

A SRAM memory element comprises an influencing element which sets the state of the memory cells within the memory element on start-up to defined values. These defined values are set at the design stage such that on start-up the volatile memory contains firmware or other data. Dependent upon the implementation of the influencing element, the values of stored in the memory cells may be fixed or may subsequently be overwritten during operation of the device. The memory cell may comprise two cross-coupled inverters and the influencing element comprises at least one transistor arranged to connect the input to one of the inverters to ground or a power supply rail when voltage is applied to a controlling node of the transistor.

13 Claims, 14 Drawing Sheets

MEMORY DESIGN

BACKGROUND

Silicon chips typically use non-volatile memory, i.e. memory which retains the stored data when the power to the memory is switched off, to store a program which runs on start-up. This non-volatile memory may be onboard the chip or external to the chip and typically comprises ROM (read-only memory) or flash memory. Silicon chips often contain volatile memory, such as RAM (random-access memory), to store program variables and updates which occur during operation. Furthermore, as it is generally faster to read from RAM than from ROM, the content of the ROM (e.g. the firmware) is typically copied from the ROM into the RAM on start-up and then read from the RAM.

For many applications, it is desirable to reduce the size (i.e. the area) of a silicon chip. If the size of a chip is reduced, the number of chips which can be fabricated on a silicon wafer is increased which reduces the cost of the device. Reducing the size also increases the yield of good chips from a wafer because of the reduction in likelihood of a manufacturing defect on the chip. Additionally, with the drive towards miniaturization of electronic devices (and particular consumer electronic devices), smaller chips are also advantageous.

The embodiments described below are not limited to implementations which solve any or all of the disadvantages of known silicon chip and memory designs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An improved memory design is described which removes the need to read firmware from ROM into RAM on start-up. A SRAM memory element comprises an influencing element which sets the state of the memory cells within the memory element on start-up to defined values. These defined values are set at the design stage such that on start-up the volatile memory contains firmware or other data. Dependent upon the implementation of the influencing element, the values of stored in the memory cells may be fixed or may subsequently be overwritten during operation of the device. In an example, the memory cell comprises two cross-coupled inverters and the influencing element comprises at least one transistor arranged to connect the input to one of the inverters to ground or a power supply rail when voltage is applied to a controlling node of the transistor.

A first aspect provides a static RAM memory element comprising: a plurality of RAM memory cells; and at least one influencing element arranged to set the state of at least a subset of the RAM memory cells to a specified value on start-up.

The at least one influencing element may be arranged to set the state of the subset of RAM memory cells to specified values on start-up such that the subset of RAM memory cells contains firmware.

The at least one influencing element may be arranged to set the state of a first subset of RAM memory cells to specified values on start-up such that the subset of RAM memory cells contains a first program and to set the state of a second subset of RAM memory cells to specified values on start-up such that the subset of RAM memory cells contains a second program. In operation the state of memory cells one of the first and second subsets of RAM memory cells is overwritten.

The RAM memory cell may comprise two cross-coupled inverters, a first node at an input to a first of the inverters and a second node at an input to a second of the inverters and wherein the at least one influencing element comprises at least one transistor arranged to connect one of said first and second nodes to one of ground and a power supply rail when voltage is applied to a controlling node of the transistor.

An influencing element may comprise at least one pair of transistors, wherein one of the pair of transistors is arranged to connect one of said first and second nodes to one of ground and a power supply rail when voltage is applied to a controlling node of the transistor.

The at least one transistor may be arranged to connect a node in each of a plurality of RAM memory cells to one of ground and a power supply rail when voltage is applied to a controlling node of the transistor.

The RAM memory cell may comprise two cross-coupled inverters, a first node at an input to a first of the inverters and a second node at an input to a second of the inverters and wherein the at least one influencing element comprises a diode placed between one of said first and second nodes and an input rail, such that when the voltage of the input rail is changed between high and low values, the influencing element sets the state of the memory cell.

The RAM memory cell may comprise two cross-coupled inverters, a first node at an input to a first of the inverters and a second node at an input to a second of the inverters and wherein the at least one influencing element comprises a diode placed between one of said first and second nodes to one of ground and a power supply rail.

The RAM memory cell may comprise two cross-coupled inverters, a first node at an input to a first of the inverters and a second node at an input to a second of the inverters and wherein the at least one influencing element comprises at least one capacitor created between a metal track forming an input to a one of the inverters and a metal track formed in a separate layer and connected to one of ground and a power supply rail.

The RAM memory cell may comprise two cross-coupled inverters, a first node at an input to a first of the inverters and a second node at an input to a second of the inverters and wherein the at least one influencing element comprises an electrical connection between one of said first and second nodes to one of ground and a power supply rail.

A second aspect provides a silicon chip comprising a static RAM memory element as described above.

A third aspect provides a method of fabricating a static RAM memory element comprising: forming a plurality of RAM memory cells and at least one influencing element arranged to set a state of at least a subset of the RAM memory cells to a specified value on start-up; and selecting and using a mask layer arranged to define the state of at least the subset of the RAM memory cells by forming electrical connections between nodes in the subset of RAM memory cells and a power rail.

A fourth aspect provides a static RAM memory element comprising a plurality of RAM memory cells substantially as described with reference to FIGS. 3-5, 6A-B, 7A-C, 8A-B, 9 and 10 of the drawings.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
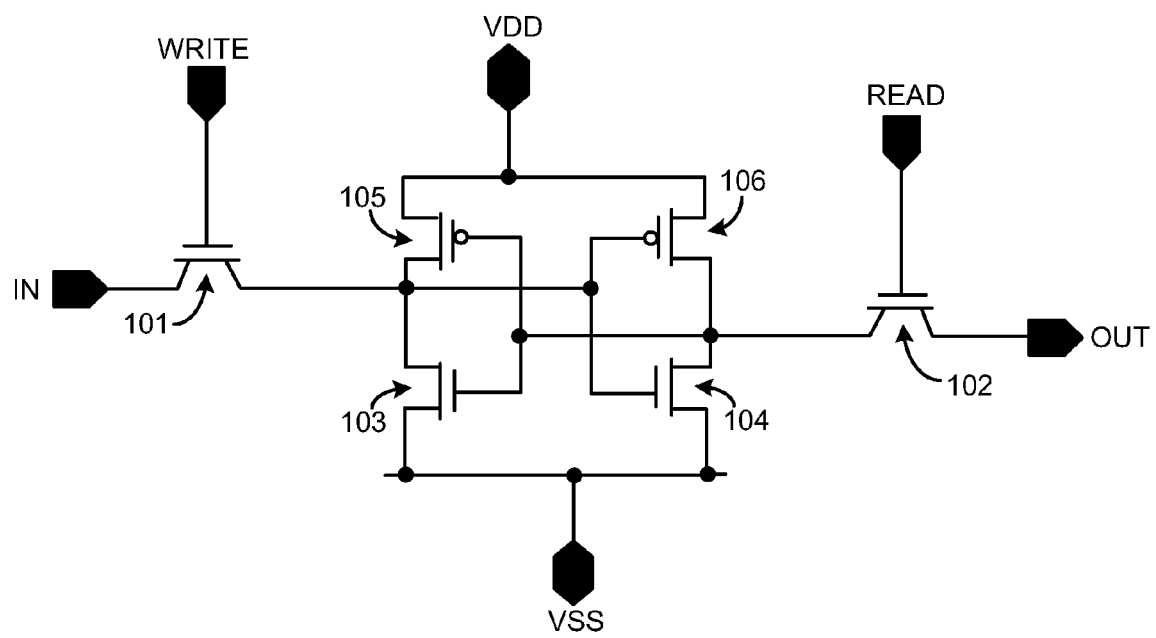
FIG. 1 is a schematic diagram of a standard static RAM (SRAM)

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

FIG. 1 is a schematic diagram of a standard SRAM (static RAM) cell 100 which comprises six transistors 101-106. In the example shown, four of the transistors 101-104 are NMOS (n-channel Metal Oxide Semiconductor) transistors and two of the transistors 105-106 are PMOS (p-channel MOS) transistors. The cell 100 stores a bit of information in the flip-flops formed by the transistors and a bit, once written into the SRAM, stays there until it is re-written or the power is turned off. Examples of the operation of such a standard SRAM cell can be described with reference to FIG. 2, which shows an alternative representation of the standard cell 200 using NOT gates (or inverters) 201-202. These NOT gates are implemented using transistors and therefore the representations in FIGS. 1 and 2 are equivalent.

The SRAM cell can be considered to have three states: standby, reading and writing. In the standby state, the two transistors 101-102 isolate the cell from the input/output lines and the cell maintains the information stored within it through the reinforcing effect of the cross-coupled NOT gates 201-202. If a '1' is stored in the cell, node 210 is a '1' and the output of gate 201 is a '0' so that node 220 is a '0'. Consequently the input to gate 202 is a '0' and the output is a '1', reinforcing the existing state of node 210. To write information into the cell, e.g. to change the information stored from a '1' (as described above) to a '0' the input 203 is set to a '0' and the write input 204 is taken high (this may also be described as asserting the write line). In this situation the cell is no longer isolated from the input line and this causes the state of the cross-coupled NOT gates to flip: node 210 is pulled down to a '0' and node 220 is pulled up to a '1'. This new state will then be reinforced, as described above, when the cell is isolated from the input line by transistor 101. To read information from the cell, the read input 205 is taken high, which means that the cell is no longer isolated from the output 206.

Figure 2:
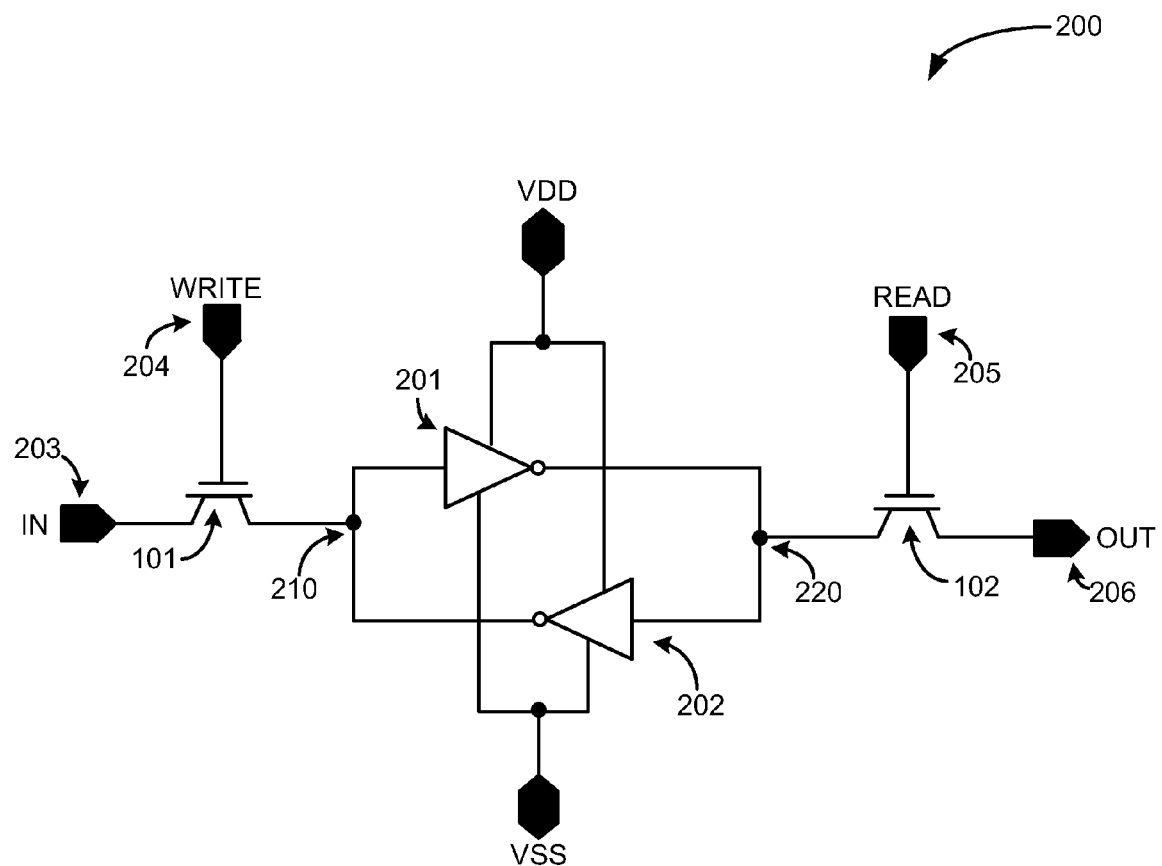
FIG. 2 shows an alternative representation of a standard SRAM.

It will be appreciated that FIGS. 1 and 2 show examples of a standard SRAM cell and alternative designs exist, such as cells which contain a larger number of transistors (e.g. 8, 10 or more transistors per cell) and/or cells which use both nodes 210-220 to read in and write out data. Furthermore, it will be appreciated that although in the example above, the value of node 210 represents the value of the bit of information stored, in other examples the value node 220 may alternatively represent the value of the bit of information stored in the memory cell. For the purposes of explanation only, the following description uses the convention that the value of the bit of information stored corresponds to the state at node 210 or corresponding nodes in the subsequent diagrams (e.g. nodes 310, 410, 510 etc).

Figure 3:
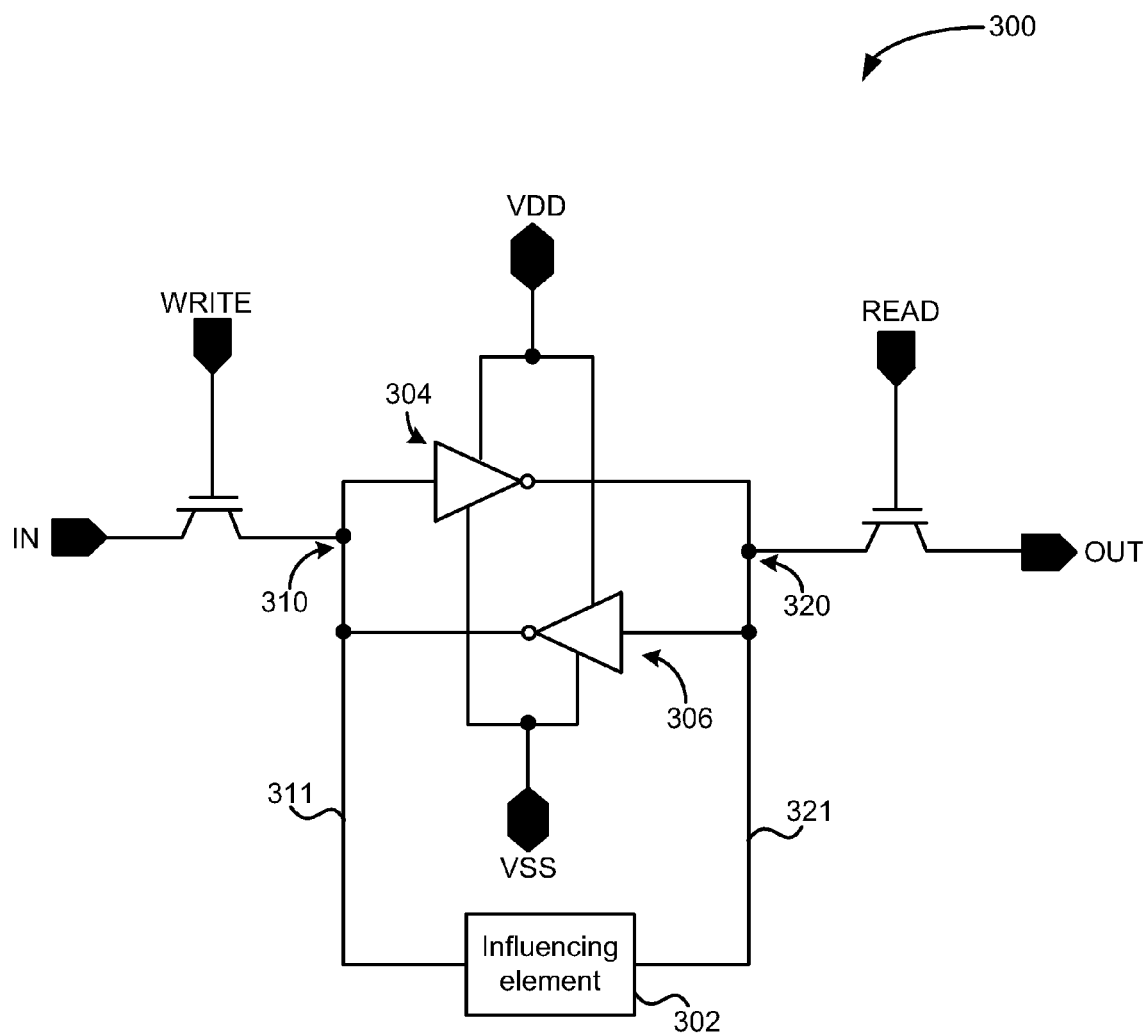
FIG. 3 shows a schematic diagram of an improved memory cell.

FIG. 3 shows a schematic diagram of an improved memory cell 300 which comprises an influencing element 302. The influencing element 302 comprises one or more circuit elements and is arranged to influence the initial state of the memory cell. This is achieved by influencing the start-up states at one or both nodes 310, 320 and although FIG. 3 shows the influencing element interacting with both nodes 310, 320 this is by way of example only and in other examples only one of the connections 311, 321 may be present. This influencing element 302 enables a chip designer to design a memory cell with a known (and fixed) initial state, e.g. a memory cell which has an initial state of storing a '1' or a memory cell which has an initial state of storing a '0'.

Where the state of a single node is influenced, the designer can either choose which node to influence with a fixed state (e.g. by influencing the node 310 or node 320 such that it has an initial value of '1', thereby storing a '1' or a '0' respectively) or how to influence a particular node (e.g. by influencing the node 310 such that it has an initial value of '1' or '0', thereby storing a '1' or '0' respectively). As described above, however, the initial state is fixed by the designer at the design stage.

There are many different arrangements of circuit elements such as vias, transistors, diodes, capacitors etc which may be used to form the influencing element 302 and a number of different examples are described below.

The example shown in FIG. 3 and the further examples described below all use the representation of the standard SRAM cell as shown in FIG. 2 as the memory cell that is influenced. This is by way of example only and other standard SRAM cells may alternatively be used.

Dependent upon the particular implementation of the influencing element 302, the bit of information stored in the cell may be fixed permanently (i.e. the states at the nodes 310, 320 may be fixed) or the bit stored may be able to be changed during operation (i.e. by over-writing the initial state). For example, the influencing element 302 may be used to ensure that on start-up the initial state of a memory cell stores a particular bit of information and this may subsequently be modified during operation of the chip which comprises the memory cell. Where it is possible to change the bit of information stored during operation, it may also be possible to reset the bit back to the initial state if required and this is described in more detail below. As a result the initial state may alternatively be referred to as a default or reset state of the memory cell.

There are many different applications of the improved memory cell designs described herein and they may be used on any silicon chip which comprises SRAM cells and which requires software on board or which loads software or other data into the RAM on start-up. For example, the influencing element 302 may be used to ensure that on start-up the initial state of a memory element on a chip stores the program that is to be run on start-up (the firmware). The term 'memory element' is used herein to refer to a group of memory cells, such as an array of memory cells, which are collectively capable of storing many bits of information. The data stored in some/all of the memory cells may be set permanently or may subsequently be modified during operation of the chip e.g. to store changes in the program, program variables etc. In addition to, or instead of, using the influencing element to ensure that the initial state of the memory element stores a program, the influencing element may be used such that the initial state of the memory element stores other information, such as default values of parameters or variables.

Through the use of an influencing element, as described above and shown in FIG. 3, the amount of non-volatile memory (e.g. ROM) that is required on a chip may be reduced and in the limit, it may not be necessary to have any non-volatile memory on a chip. This can significantly reduce the area of a chip which results in increased yield and reduced cost per chip.

In many devices, an in particular in high speed applications, a program is typically copied from ROM to RAM on start-up. This normally requires a serial transfer of data from one memory to another which takes time. Using the improved member cell designs described herein, it is not necessary to read software into the RAM on start-up and consequently the start-up speed is increased. Additionally there is a saving in current due to the elimination of the processing required to read the data into the RAM from the ROM.

Use of the improved memory cell designs described herein can also assist in the development process. As initial versions of software may not work and will need to be updated, the development software is stored in RAM. Once finalized, the software is then stored in the ROM of the device. However, using the improved memory cell designs described herein, both the development software and the finished software are stored in RAM which means that the development software will work exactly as the finished software and problems that may be introduced in transferring the software from RAM (in development) to ROM (when finished) are avoided.

Additionally, use of the improved memory cell designs described herein adds flexibility in the use of the memory and enables the memory to be used in a number of ways and to address multiple markets. In a first example of flexibility, a memory element may be used with either the 'standard' program set by the influencing elements or with a customized program which may be stored externally to the chip on another component and subsequently written to the memory. In a second example of flexibility, a number of memory elements may be provided which each store, through the use of influencing elements (in the improved memory cell designs described herein), a different program. In operation, one of the programs may be run and the memory element(s) storing the unused programs can instead be used as RAM (i.e. the data stored in the memory cells as a result of the influencing elements can be overwritten).

Although the nodes 310, 320 are indicated in a particular position in FIG. 3, i.e. at the intersection of two connections, it will be appreciated that the position where influence is applied may be varied, such that the overall effect is to influence the initial value of the input to at least one of the NOT gates 304, 306. This generalization is also applicable to the further examples described below.

Figure 4:
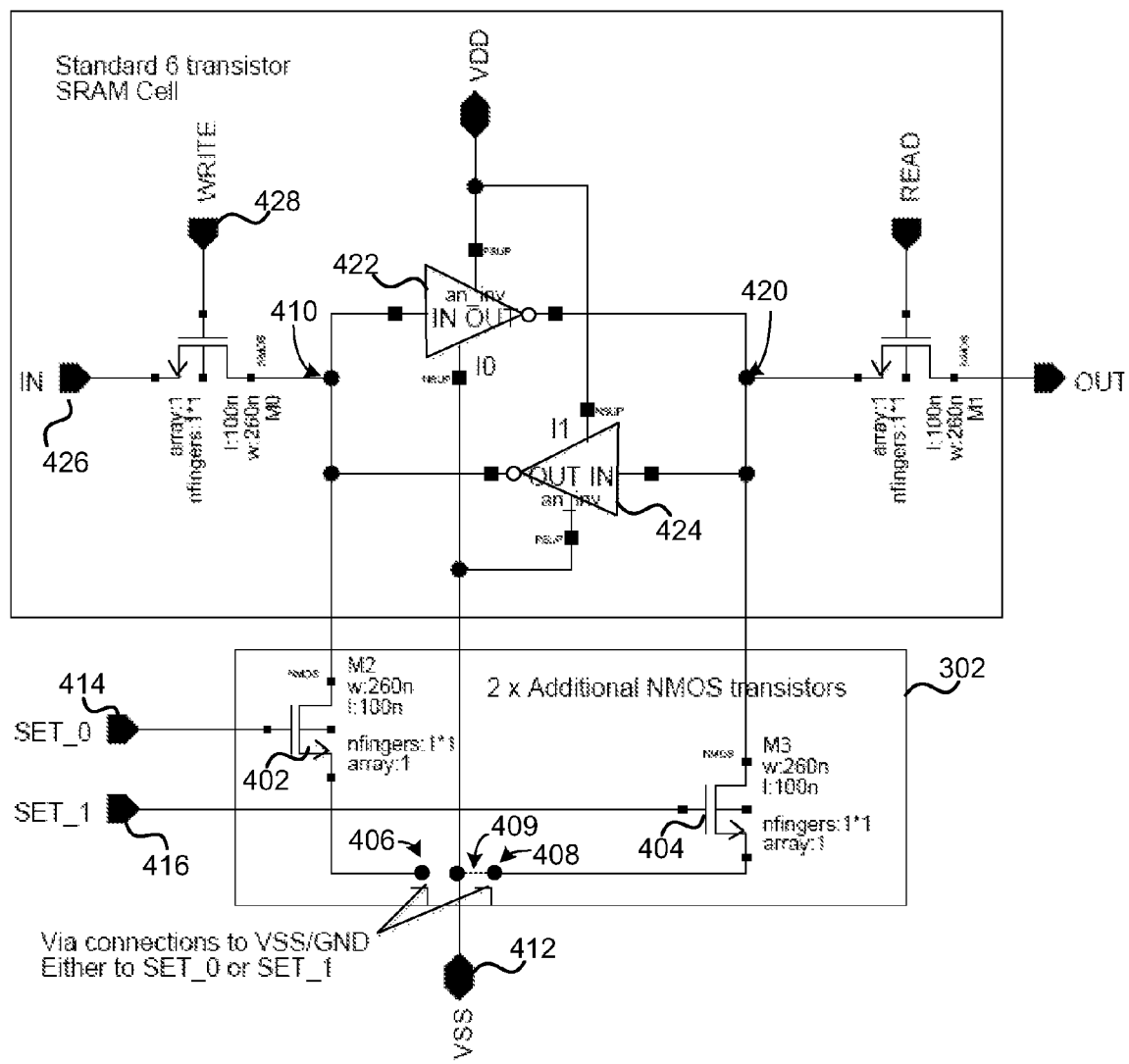
FIGS. 4, 5, 6A, 6B, 7A, 7B, 7C, 8A and 8B shows schematic diagrams of further examples of an improved memory cell.

FIG. 4 shows another example of an improved memory cell 400 in which the influencing element 302 is implemented using a pair of transistors 402, 404. In the example shown these are NMOS transistors. In this example, the initial state of the memory cell (as a result of the influencing element 302) is set by means of a connection to one of nodes 406, 408 and the choice of connection is made at the design stage. There are two possible initial states of the memory cell: a '0' at node 410, which stores a '0' in the cell or a '0' at node 420 which stores a '1' in the cell. The operation of the memory cell is described below.

If the initial state of the memory cell is required to store a '1', node 408 is connected to VSS 412 or Ground. This connection is implemented at the design stage, e.g. through inclusion of a via between node 408 and VSS/Ground. In FIG. 4, the node 408 is shown connected to VSS by the dotted connection 409. On start-up (and/or on reset), the SET_1 input 416 is taken high which results in node 420 being connected to node 408 and hence driven to a '0'. When the SET_1 input 416 is then taken low, the existing state of the memory cell is reinforced by the cross-coupled NOT gates 422, 424 until it is overwritten or the power to the cell is lost. The value of the bit stored in the memory cell may be overwritten by asserting the WRITE input 428 in a corresponding manner to that described above with reference to FIG. 2.

If alternatively the initial state of the memory cell is required to store a '0', node 406 is instead connected to VSS 412 or Ground (not shown in FIG. 4). In this situation, on start-up (and/or on reset), the SET_0 input 414 is taken high which results in node 410 being connected to node 406 and hence driven to a '0'. As described above, when the SET input is taken low, the state is reinforced until it is overwritten or the power to the cell is lost. Again, the value of the bit stored in the memory cell may be overwritten by asserting the WRITE input 428 in a corresponding manner to that described above with reference to FIG. 2.

Although FIG. 4 shows two SET inputs 414, 416, in another embodiment, there may only be a single SET input which is connected to both transistors 402, 404 within the influencing element 302. These SET inputs 414, 416 (and the similar SET inputs in FIGS. 5 and 9) may be considered to enable voltage to be applied to controlling nodes of the transistors 402, 404. In the example shown, where the transistors are CMOS transistors, this controlling node is the gate of the transistor.

Figure 5:
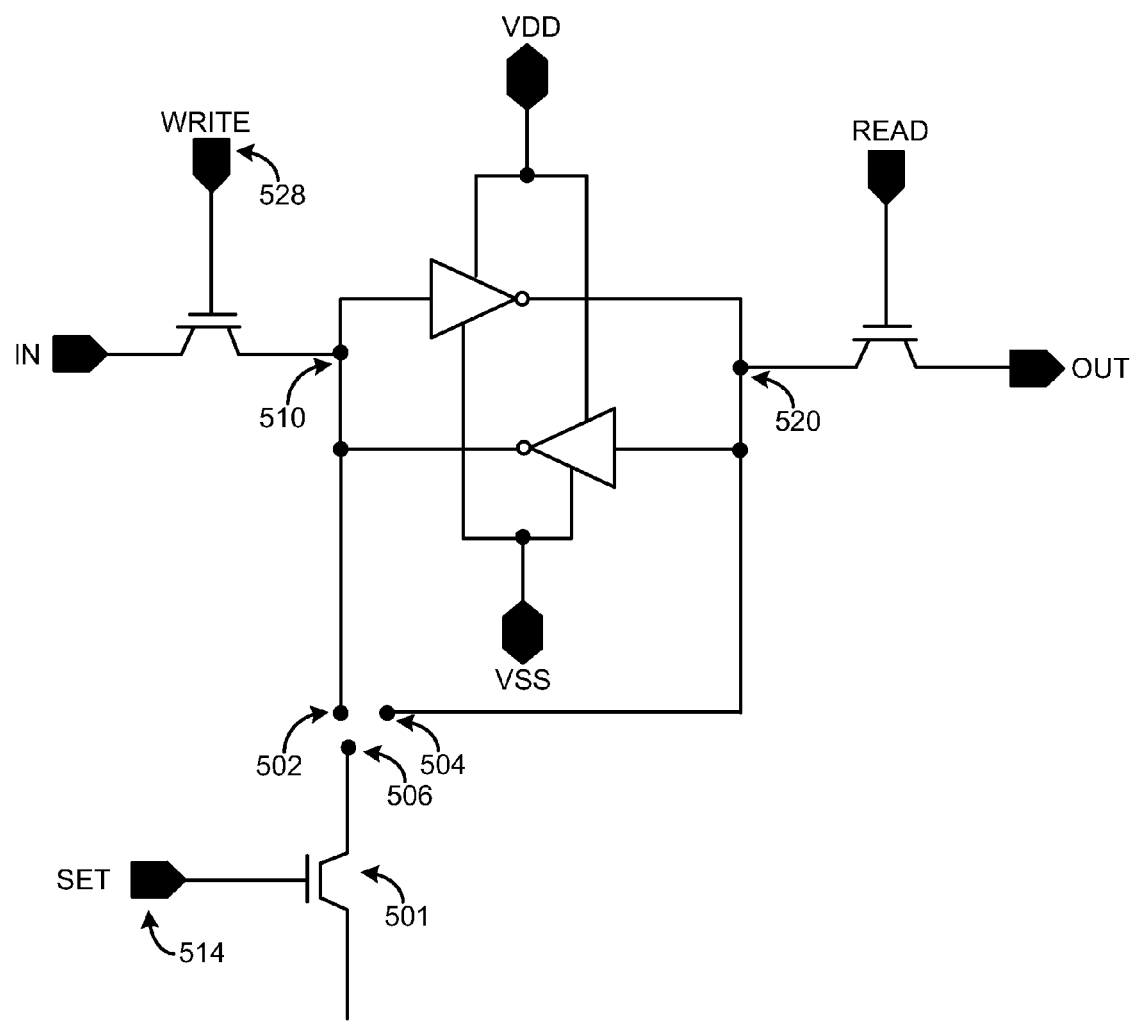

Whilst FIG. 4 shows two additional transistors in the memory cell, the influencing element may alternatively be implemented using a single additional transistor as shown in FIG. 5. In this example, the initial state of the memory cell is set by selectively connecting either node 510 or 520 to the transistor 501. This may be achieved by connecting either node 502 or node 504 to node 506, e.g. using a via or metal track.

In a first configuration, if node 502 is connected to node 506, on start-up (and/or on reset), the SET input 514 is taken high which results in node 510 being connected to ground and hence driven to a '0'. This results in a '0' being stored as the initial state of the memory cell. In the alternative configuration, node 504 is connected to node 506. In this arrangement, node 520 is connected to ground when the SET input 514 is taken high and a '1' is stored as the initial state of the memory cell. As described above and in either configuration, when the SET input is taken low, the initial state is reinforced until it is overwritten or the power to the cell is lost. The value of the bit stored in the memory cell may be overwritten by asserting the WRITE input 528 in a corresponding manner to that described above with reference to FIG. 2.

Figure 6A:
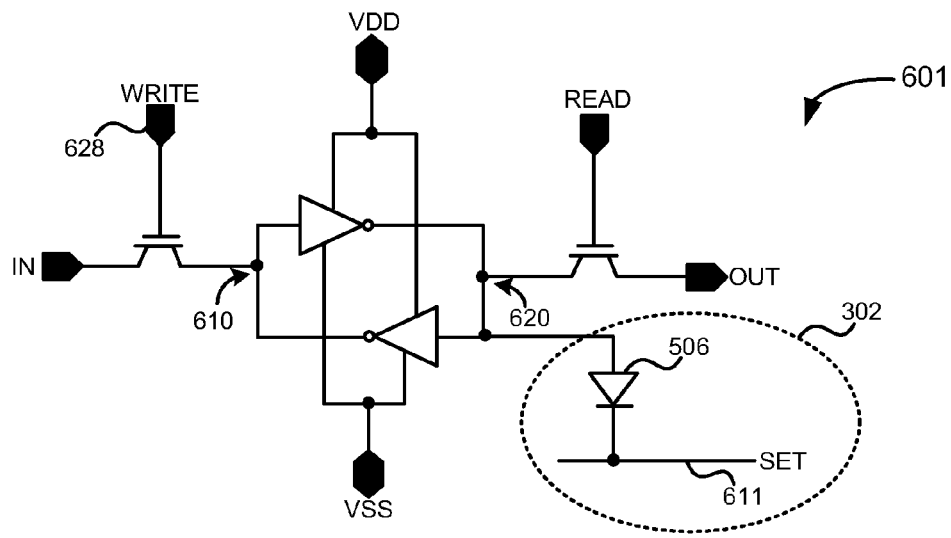
Figure 6A:
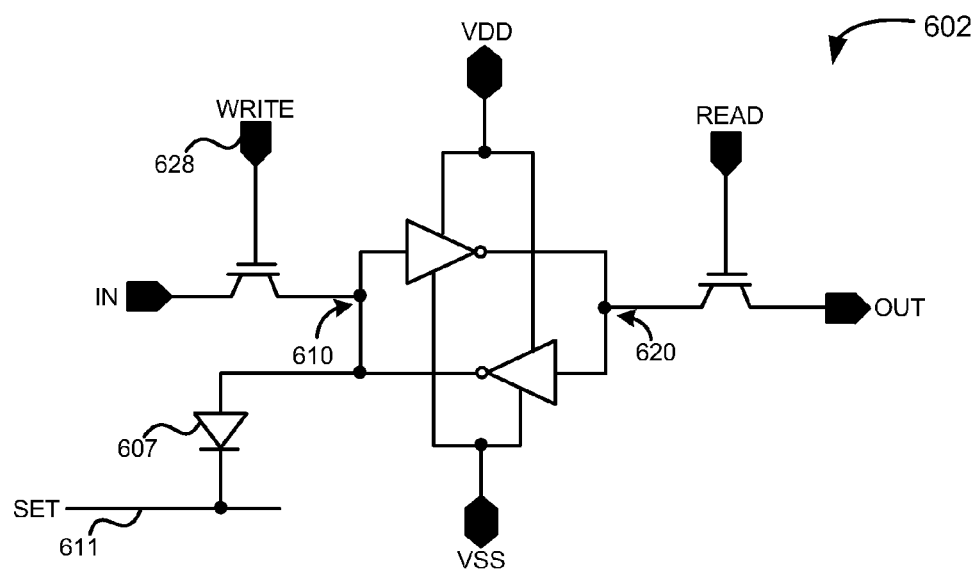
Figure 6B:
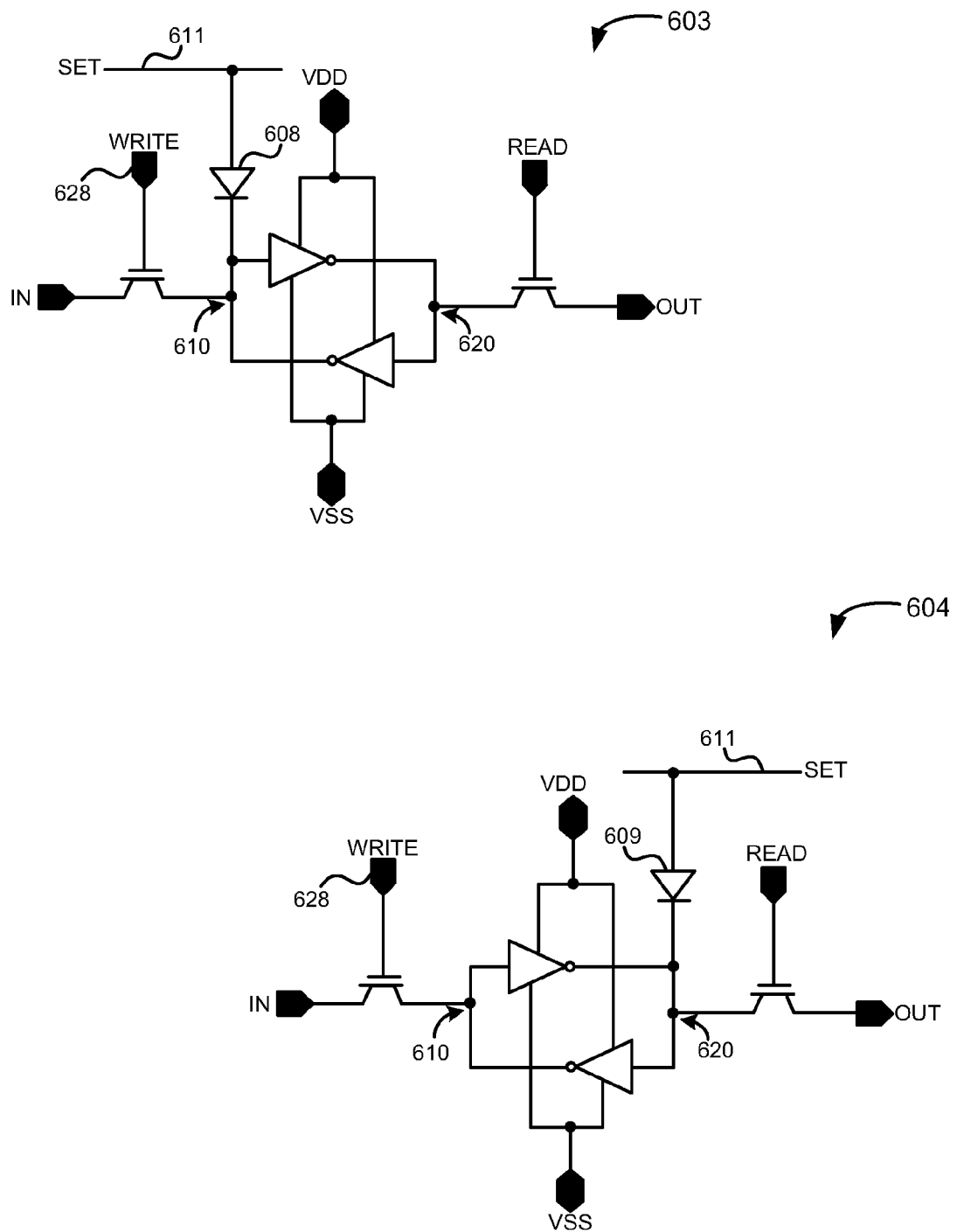

FIGS. 6A and 6B show further examples of an improved memory cell 601-604 in which the influencing element 302 comprises a diode 606-609 to a SET rail 611 (e.g. as indicated by the dotted outline in example 601). Of these examples, two influence the state at node 610 (examples 602, 603), two influence the state at node 620 (examples 601, 604), two result in a '1' being stored (examples 601, 603) and two result in a '0' being stored (examples 602, 604), as is described in more detail below.

The first example 601 has an initial state of storing a '1' and this is achieved by taking the SET line 611 low, from a normally high state. This allows current to flow through diode 606 and the state of node 620 is pulled low.

The second example 602 has an initial state of storing a '0' and is also achieved by taking the SET line 611 low, from a normally high state. This allows current to flow through diode 607 and the state of node 610 is pulled low.

The third example 603 has an initial state of storing a '1' and is also achieved by taking the SET line 611 high, from a normally low state. This allows current to flow through diode 608 and the state of node 610 is pulled high.

The third example 604 has an initial state of storing a '0' and is also achieved by taking the SET line 611 high, from a normally low state. This allows current to flow through diode 609 and the state of node 620 is pulled high.

In these examples, the initial state of the memory cell (as a result of the influencing element 302) may be set through selection of the appropriate materials used in fabrication of the diode in order to set the direction in which current flows through the diode (e.g. to produce either 602 or 603, or alternatively either 601 or 604) or by means of a connection between one of nodes 610, 620 and a diode (e.g. to produce either 601 or 602, or alternatively either 603 or 604).

In all of these examples 601-604, the value of the bit stored in the memory cell may be overwritten, once the value of the SET line 611 is in its normal state, by asserting the WRITE input 628 in a corresponding manner to that described above with reference to FIG. 2.

Although the examples shown in FIGS. 6A and 6B each comprise a single diode, it will be appreciated that two diodes may alternatively be used in order to influence both nodes 610 and 620. For example, an influencing element may comprise diodes 606 and 608 or diodes 607 and 609.

In a further set of examples using diodes, not shown in FIG. 6A or 6B, the nodes 610, 620 may be connected to a power supply rail (VDD/VSS) or ground instead of a SET rail 611. In such examples, however, it is not possible to overwrite the value stored in the memory cell and it is fixed in the initial state.

Figure 7A:
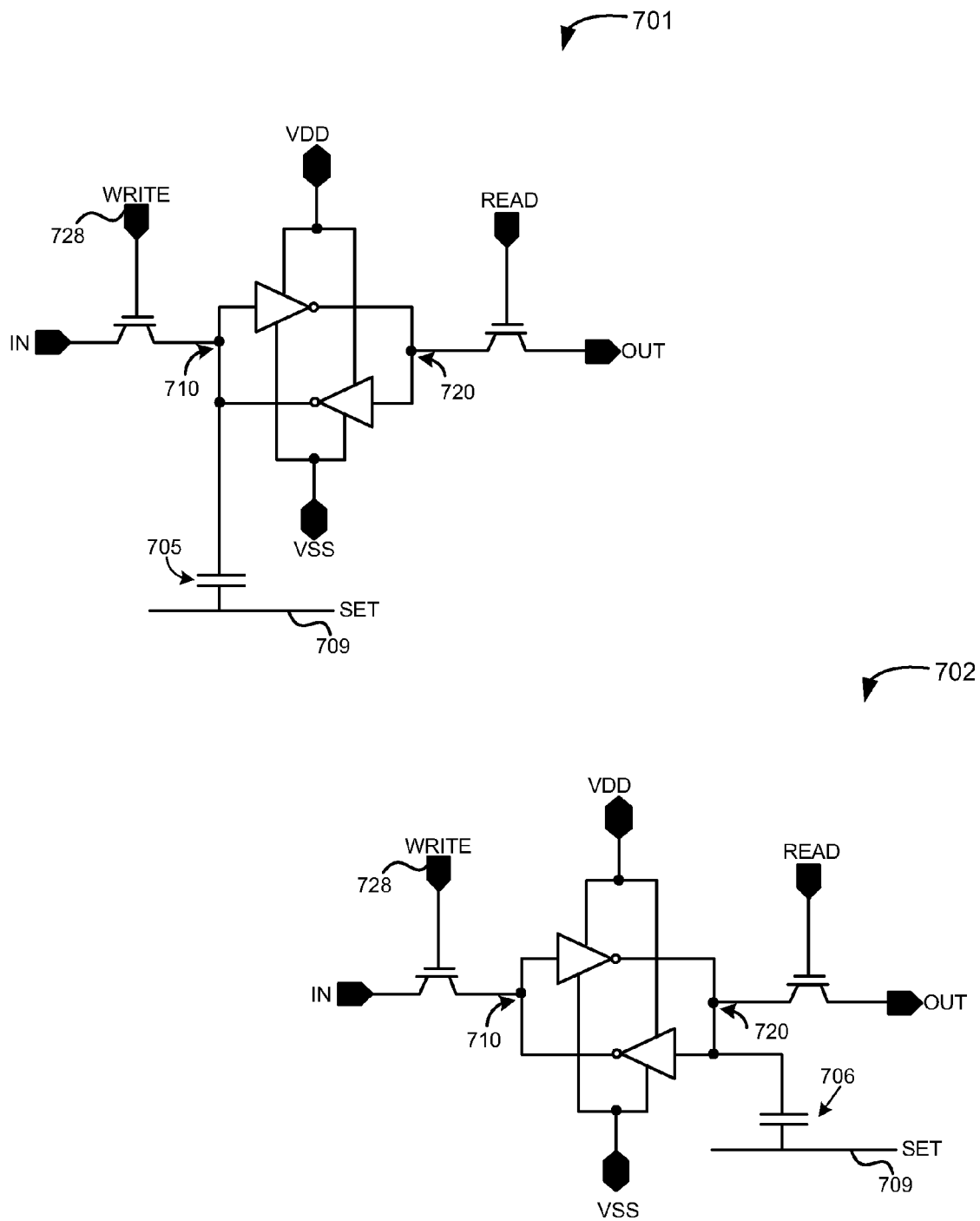
Figure 7B:
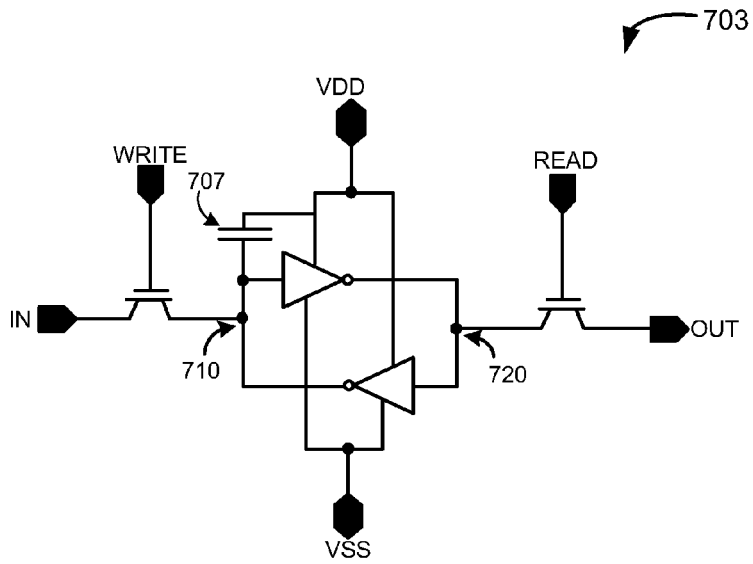
Figure 7B:
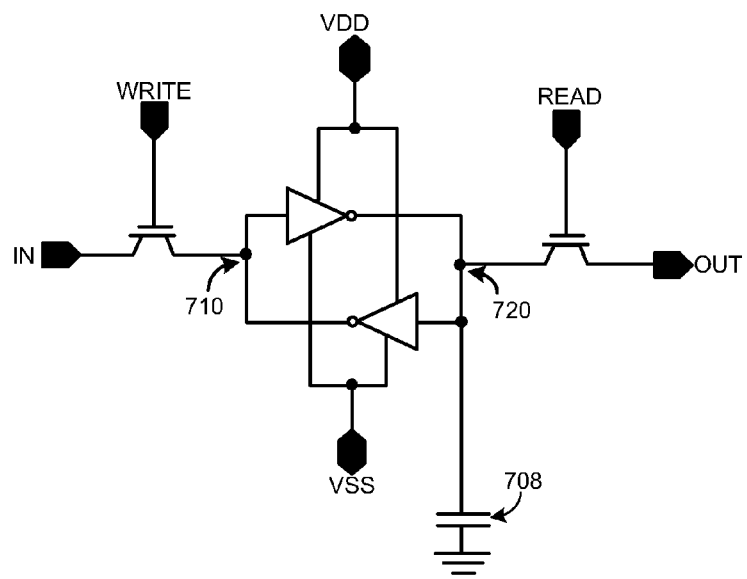

FIGS. 7A and 7B show another set of examples 701-704 which use capacitors 705-708 to influence the initial state of the memory cell. In the first two examples 701, 702 shown in FIG. 7A, the capacitors 705, 706 connect either node 710 or 720 to a SET line 709. By pulling the SET line 709 high or low on start up the initial state of the memory cell can be set to '1' or '0'. If the memory cell uses a SET line 709 which is pulled high on start-up (or reset), then the first example 701 would store a '1' and the second example 702 would store a '0'. In the alternative configuration where a SET line 709 which is pulled low on start-up (or reset) is used, the first example 701 would store a '0' and the second example 702 would store a '1'.

In the third and fourth examples 703, 704 in FIG. 7B, the capacitors are used to connect the nodes 710, 720 to one of the power rails or ground. In these cases the state of the memory cell is fixed, compared to the first two examples where the values stored can be overwritten by asserting the WRITE input 728.

Although the examples shown in FIGS. 7A and 7B each comprise a single capacitor, it will be appreciated that two capacitors may alternatively be used in order to influence both nodes 710 and 720. For example, an influencing element may comprise capacitors 707 and 708. In another example, an influencing element may comprise capacitors 705 and 706 where each capacitor connects to a different SET line, such that there are two SET lines. Of these two SET lines, one is pulled high on start-up and the other is pulled low on start up.

Figure 7C:
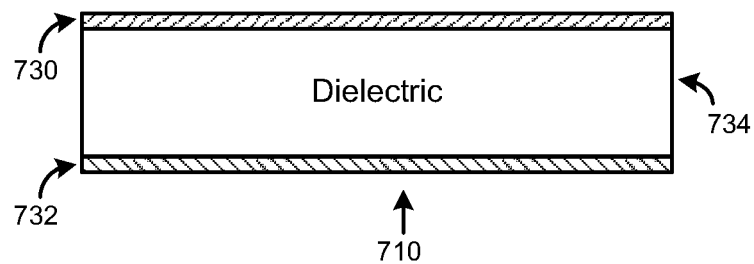

Through the use of capacitors, e.g. as shown in FIGS. 7A and 7B, the value at one or both of nodes 710, 720 may be influenced by an electric field, rather than through a physical connection to the nodes (as in other examples). The capacitors may be implemented using an additional metal layer 730, as shown in FIG. 7C, to form tracks above the nodes 710, 720 (e.g. formed in metal layer 732) and using either the existing dielectric layers within the chip or an additional dielectric layer 734.

Figure 8A:
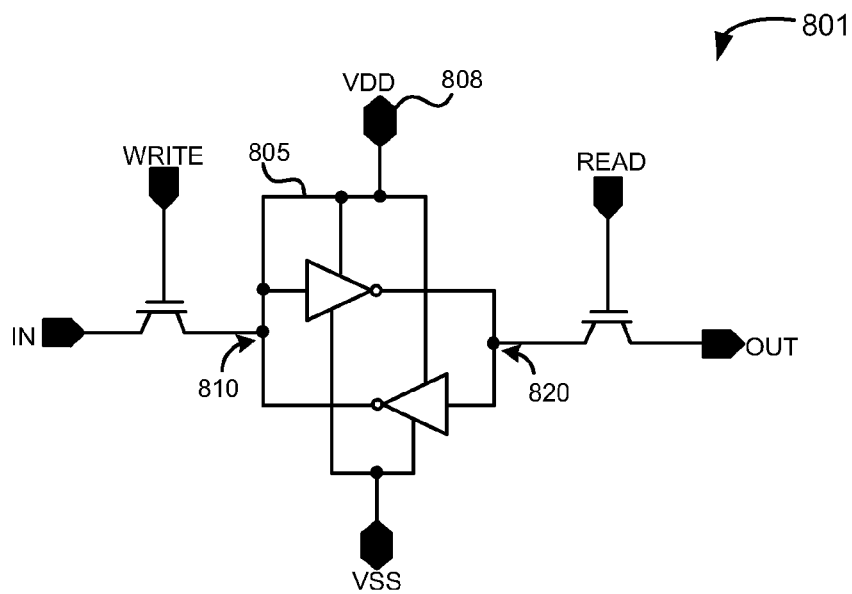
Figure 8A:
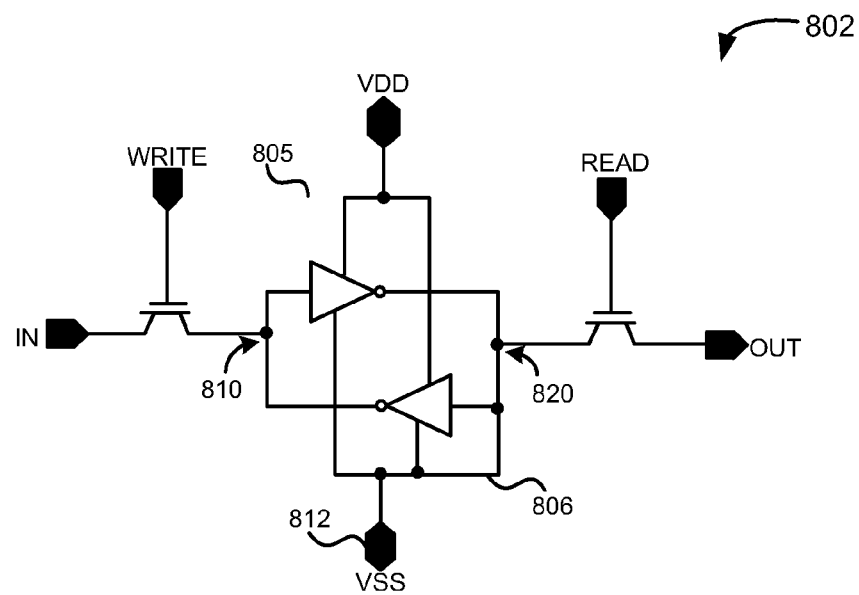
Figure 8B:
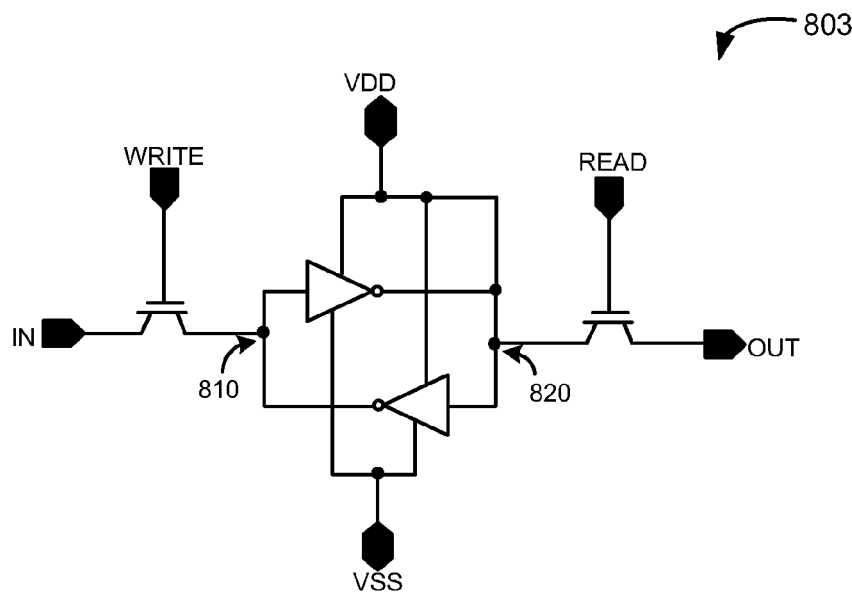
Figure 8B:
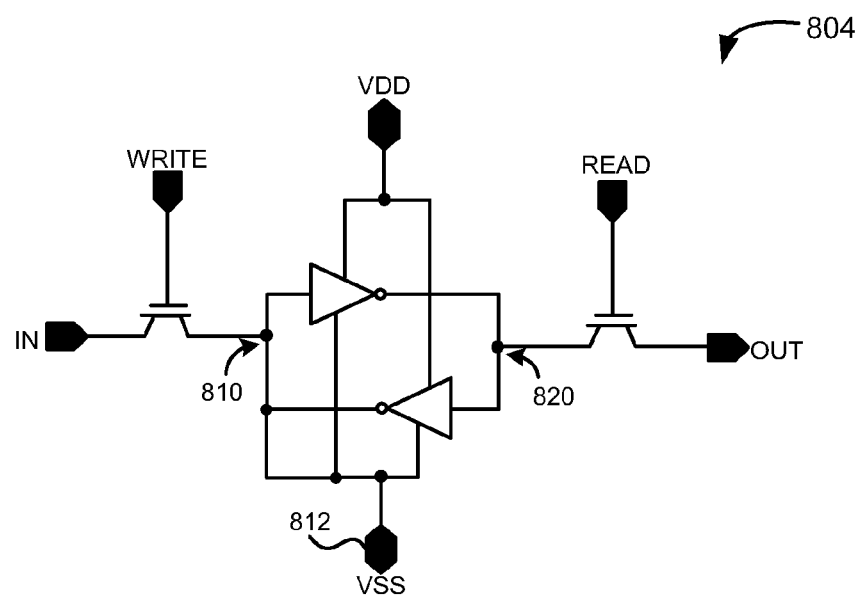

FIGS. 8A and 8B show a set of examples in which the influencing element comprises a connection (e.g. 705, 706) between one of the nodes 810, 820 and a power rail 808, 812 (VDD/VSS), e.g. connection 805 in example 801 which connects node 810 to VDD 808. It will be appreciated that the nodes could alternatively be connected to ground instead of VSS (e.g. in examples 802 and 810). By directly connecting the nodes to a power rail (or ground), the value of the node is fixed and therefore the bit of information stored within the memory cell is also fixed. This results in a memory cell which is read-only.

Whilst fixing the data stored in the memory cells could be considered to reduce the flexibility of the memory, in many situations this flexibility may not be exploited and therefore this may not restrict the operation of the chip, e.g. where firmware is loaded into the memory cells on start-up and then the values stored in these cells do not change during the operation of the chip. Furthermore, where only a few values would usually be changed during operation, use of the techniques shown in FIGS. 8A and 8B (or other examples which render the SRAM read-only) may still provide a reduction in chip size by eliminating the need for standard ROM (as distinguished from the read only RAM shown in FIGS. 8A and 8B), even if the size of the RAM is increased slightly.

Although the examples shown in FIGS. 8A and 8B each comprise a single additional connection (e.g. connection 805), it will be appreciated that both nodes 810, 820 may be connected to a power rail or ground so as to fix the state of the node.

It will be appreciated that there are many different ways that the influencing element 302 can be implemented and the circuits shown in FIGS. 4-8 provide a number of examples which use different types of components. The influencing element may, however, be implemented using any combination of the techniques shown in FIGS. 4-8 and/or using alternative techniques and/or components.

A silicon chip comprises a large number of memory cells which may form one or more memory elements. An improved memory element may comprise a plurality of improved memory cells (which include an influencing element) such as a plurality of memory cells shown in any of FIGS. 3-8. In addition to the improved memory cells (as described herein), the memory element may also comprise a plurality of standard memory cells where it is not possible to influence the initial state of the memory cell.

In an example of an improved memory element, the memory element comprises a plurality of memory cells 400 (as shown in FIG. 4) such that there are two additional transistors 402, 404 per bit of information stored within the memory element in its initial state. In further examples of improved memory elements, however, the number of additional components (e.g. additional transistors) may be reduced by sharing them between memory cells on a per byte, per word or per block basis or for any other subset of memory cells within the memory element (where the subset may comprise the entire memory element). An example is shown in FIG. 9 in which the two additional transistors 902, 904 are shared between two memory cells 906, 908.

Figure 9:
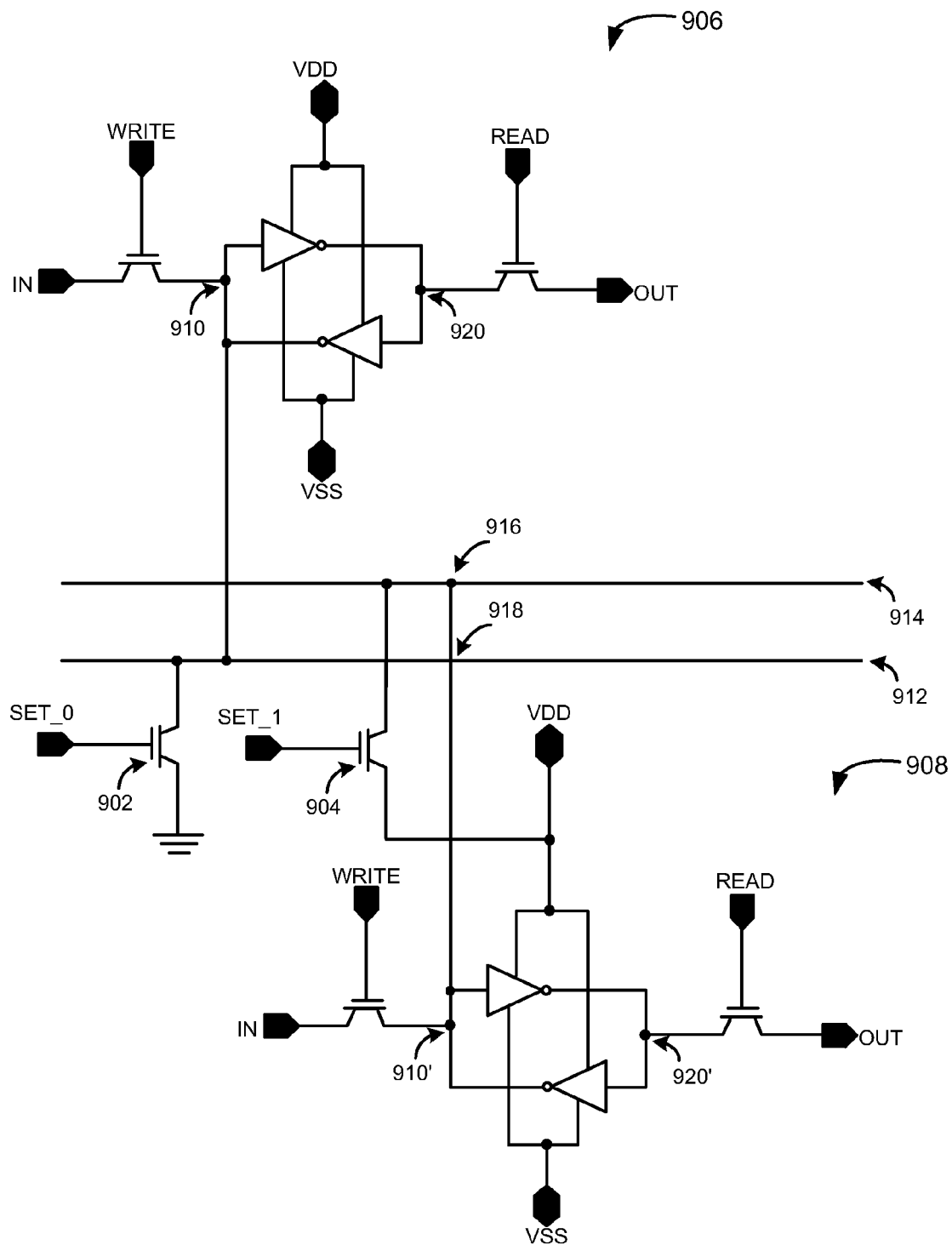
FIG. 9 shows a schematic diagram of an improved memory element.

In the example shown in FIG. 9, one memory cell 906 is set with an initial state of '0' because node 910 is connected via transistor 902 to ground when the SET_0 input is taken high. The other memory cell 908 is set with an initial state of '1' because node 910' is connected via transistor 904 to VDD when the SET_1 input is taken high. Using this arrangement, a designer can select the initial data to be stored within the memory element by choosing how to connect the individual memory cells (e.g. nodes 910, 920, 910', 920') to the rails 912, 914, one of which is pulled high and the other of which is pulled low when the SET inputs are asserted. In other examples, not shown in FIG. 9, the arrangements of components shown in any of FIGS. 4-8 may alternatively be used to pull the rails 912, 914 high/low. In yet further examples, a single rail may be used, such as a rail which is pulled low (or high) on start-up and in this example, a designer may fix the initial state of each memory cell by selectively connecting either node 910, 910' or node 920, 920' to the rail. Again, any of the arrangements of components described with reference to FIGS. 3-8 may be used to pull the single rail high/low.

Many of the examples described above use one or two SET inputs to set/reset the memory cells into the initial (or default) state. These SET inputs may be controlled externally (e.g. from off the chip) or an existing reset (e.g. on the RAM) may be used.

Silicon chips which include memory cells and memory elements as described above are fabricated using multiple patterning and chemical processing steps (e.g. deposition and etching steps). Typically, the patterning steps use masks and lithographic techniques. Although the initial state of an memory cell (which is set by the influencing element 302) is specified at the design stage, in many example implementations (including those shown in FIGS. 4-9), the initial state may be set using a single mask layer (e.g. a via or metal layer). This means that if it is necessary to change the initial information stored on a particular chip, this can be achieved by changing the design of a single layer within the manufacturing process, without necessarily having to change any of the other layers.

Figure 10:
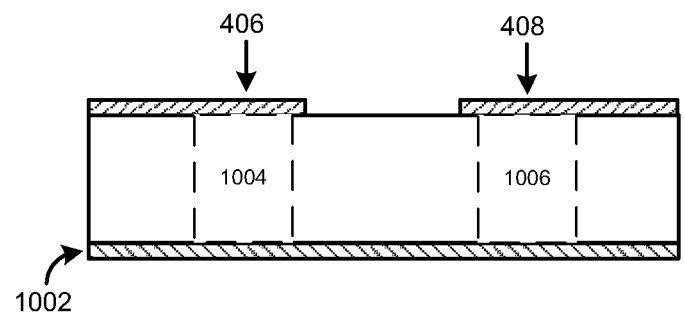
FIG. 10 shows a simplified cross-section through the improved memory cell shown in FIG. 4.

A first example of this can be described with reference to FIGS. 4 and 10. In the arrangement shown, the initial state of the memory cell 400 can be set by placing a via at which either connects node 406 to VSS/ground 1002 (e.g. at position 1004 shown in the simplified cross-section 1001) or connects node 408 to VSS/ground 1002 (e.g. at position 1006). A second example can be described with reference to FIG. 8, where the nodes 810, 820 may be selectively connected to VDD, VSS or ground using a via or a metal track. A third example can be described with reference to FIG. 9, where the vias may be positioned to connect a node 910, 910' to either rail 912 or 914. For example, the connection between node 910' and rail 914, shown in FIG. 9, may be made using a via at position 916; however, by alternatively placing a via at a position marked by arrow 918, node 910' would instead be connected to rail 912.

As described above, there are many applications for the improved memory cells described above. In an example, the techniques described may be used to design and subsequently fabricate a chip which does not contain any non-volatile memory but does not require external non-volatile memory from which to load firmware on start-up. The chip comprises at least one memory element where the initial state of at least a subset of the memory cells is influenced on start-up such that the memory element (in its initial state) stores the firmware which is run on the chip. In addition to the firmware, the memory element(s), when in their initial state, may store other information such as system information and/or address information. As described above, the information stored in the initial state may be maintained throughout the operation of the chip or may be overwritten in some (or all) of the memory cells. The memory element may also comprise a plurality of standard memory cells where the initial state is not defined.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

What is claimed is:

1. A static RAM memory element comprising: a plurality of RAM memory cells; and at least one influencing element arranged to set a state of at least a subset of the RAM memory cells to a specified value on start-up so that on start-up the subset of the RAM memory cells contains program code without copying data to the subset of RAM memory cells from another memory location.

2. A static RAM memory element according to claim 1, wherein the program code comprises firmware.

3. A static RAM memory element according to claim 1, wherein the program code comprises a first program and a second program, and wherein the at least one influencing element is arranged to set the state of a first subset of RAM memory cells to specified values on start-up such that the subset of RAM memory cells contains the first program and to set the state of a second subset of RAM memory cells to specified values on start-up such that the subset of RAM memory cells contains the second program.

4. A static RAM memory element according to claim 1, wherein in operation the state of memory cells on the first and second subsets of RAM memory cells is overwritten.

5. A static RAM memory element according to claim 1, wherein the RAM memory cell comprises two cross-coupled inverters, a first node at an input to a first of the inverters and a second node at an input to a second of the inverters and wherein the at least one influencing element comprises at least one transistor arranged to connect one of said first and second nodes to one of ground and a power supply rail when voltage is applied to a controlling node of the transistor.

6. A static RAM memory element according to claim 5, wherein the at least one influencing element comprises at least one pair of transistors, wherein one of the pair of transistors is arranged to connect one of the said first and second nodes to one of ground and a power supply rail when voltage is applied to a controlling node of the transistor.

7. A static RAM memory element according to claim 5, wherein the at least one transistor is arranged to connect a node in each of a plurality of RAM memory cells to one of ground and a power supply rail when voltage is applied to a controlling node of the transistor.

8. A static RAM memory element according to claim 1, wherein the RAM memory cell comprises two cross-coupled inverters, a first node at an input to a first of the inverters and a second node at an input to a second of the inverters and wherein the at least one influencing element comprises a diode placed between one of said first and second nodes and an input rail, such that when the voltage of the input rail is changed between high and low values, the influencing element sets the state of the memory cell.

9. A static RAM memory element according to claim 1, wherein the RAM memory cell comprises two cross-coupled inverters, a first node at an input to a first of the inverters and a second node at an input to a second of the inverters and wherein the at least one influencing element comprises a diode placed between one of said first and second nodes to one of ground and a power supply rail.

10. A static RAM memory element according to claim 1, wherein the RAM memory cell comprises two cross-coupled inverters, a first node at an input to a first of the inverters and a second node at an input to a second of the inverters and wherein the at least one influencing element comprises at least one capacitor created between a metal track forming an input to a one of the inverters and a metal track formed in a separate layer and connected to one of ground and a power supply rail.

11. A static RAM memory element according to claim 1, wherein the RAM memory cell comprises two cross-coupled inverters, a first node at an input to a first of the inverters and a second node at an input to a second of the inverters and wherein the at least one influencing element comprises an electrical connection between one of said first and second nodes to one of ground and a power supply rail.

12. A silicon chip comprising a static RAM memory element according to claim 1.

13. A method of fabricating a static RAM memory element comprising: forming a plurality of RAM memory cells and at least one influencing element arranged to set a state of at least a subset of the RAM memory cells to a specified value on start-up so that on start-up the subset of the RAM memory cells contains program code without copying data to the subset of RAM memory cells from another memory location; and selecting and using a mask layer arranged to define the state of a least the subset of the RAM memory cells by forming electrical connections between nodes in the subset of RAM memory cells and a power rail.

* * * * *

UNITED STATES PATENT AND TRADEMARK OFFICE
CERTIFICATE OF CORRECTION

PATENT NO. : 8,526,218 B2
APPLICATION NO. : 13/009583
DATED : September 3, 2013
INVENTOR(S) : Paul Egan et al.

Page 1 of 1

It is certified that error appears in the above-identified patent and that said Letters Patent is hereby corrected as shown below:

In the Specification

Column 3, line 7, delete "shows" and replace with --show--.

Column 5, line 14, delete "an in" and replace with --and in--.

Column 9, line 30, delete "of an" and replace with --of a--.

In the Claims

Column 11, claim 6, line 2, delete "of the said" and replace with --of said--.

Column 12, claim 13, line 25, delete "a least" and replace with --at least--.

Signed and Sealed this
Twelfth Day of November, 2013

Teresa Stanek Rea
*Deputy Director of the United States Patent and Trademark Office*